United States Patent [19]
Schäfer

[11] Patent Number: 4,748,406
[45] Date of Patent: May 31, 1988

[54] CIRCUIT ARRANGEMENT FOR CONTROLLING A ROTARY-MAGNET MEASURING INSTRUMENT

[75] Inventor: Axel Schäfer, Bad Soden, Fed. Rep. of Germany

[73] Assignee: VDO Aloft Schindling AG, Frankfurt am Main, Fed. Rep. of Germany

[21] Appl. No.: 907,875

[22] Filed: Sep. 16, 1986

[30] Foreign Application Priority Data

Oct. 3, 1985 [DE] Fed. Rep. of Germany ....... 3535252

[51] Int. Cl.$^4$ ............................................. G01R 15/10
[52] U.S. Cl. ..................................... 324/132; 307/490; 324/123 C; 328/142
[58] Field of Search ................... 324/132, 123 C, 115; 307/490, 491, 494; 328/142, 143; 364/571, 573, 852

[56] References Cited

U.S. PATENT DOCUMENTS

4,147,989 4/1979 Brolde .............................. 328/142
4,395,678 7/1983 Pelta ................................. 324/132

Primary Examiner—Reinhard J. Eisenzopf
Assistant Examiner—Stephen M. Baker
Attorney, Agent, or Firm—Martin A. Farber

[57] ABSTRACT

A circuit arrangement for controlling a rotary-magnet measuring instrument (6) by an input voltage via a controlled source of current has a first amplifier (difference amplifier 1) with a first negative-feedback resistor ($R_2$) and a first input resistor ($R_1$). In order to linearize the approximately S-shaped characteristic curve of the rotary-magnet measuring instrument (6), the controlled source of current is developed with a characteristic curve which is defined as consisting of three straight line segments of differing slope. For this, a second amplifier (difference amplifier 8), controlled as a function of the input voltage and a semiconductor path controlled by it (2nd npn-transistor 12) which lies in series with the first input resistor ($R_1$) are provided. One input (10) of the second amplifier is connected to a constant voltage divider (divider resistors $R_3$, $R_5$) and via a second negative-feedback resistor ($R_4$), to the controlled semiconductor path and the first input resistor (at point Y). The resistances of the second negative feedback resistor ($R_4$) and of the constant voltage divider (divider resistors $R_3$, $R_5$) are small as compared the resistance of the first input resistor ($R_1$).

7 Claims, 1 Drawing Sheet

CIRCUIT ARRANGEMENT FOR CONTROLLING A ROTARY-MAGNET MEASURING INSTRUMENT

FIELD AND BACKGROUND OF THE INVENTION

The present invention concerns a circuit arrangement for controlling a rotary-magnet measuring instrument by an input voltage via a controlled source of current, the arrangement comprising a first amplifier with a first negative-feedback resistor and a first resistor.

Ammeters which are developed as rotary-magnet measuring instruments generally have a non-linear course of their characteristic curve, and their display characteristic. The course can be defined as approximately S-shaped. For the reliable and rapid reading of such rotary-magnet measuring instruments, however, a linear course of the characteristic curve is generally desirable.

If in known circuit arrangements of the aforementioned type the rotary-magnet measuring instrument is fed from a source of current which is fed by an input voltage—a measurement voltage or a voltage derived therefrom—the said non-linear relationship between the input voltage and the deflection of the pointer of the rotary-magnet measuring instrument is retained if the amplifier, as active part of the source of current, is connected in conventional manner to a first negative-feedback resistor and a first input resistor. The negative-feedback resistor and the first input resistor form a linear characteristic curve of the source of current.

In order to compensate for the non-linearity of the characteristic curve of the rotary-magnet measuring instrument, a non-linearly acting network developed, for instance, with diodes could be connected in front of the said rotary-magnet measuring instrument or source of current. However, such networks are relatively expensive if the points of differing slope of the characteristic curve are to be precisely defined and constant, particularly as a function of the temperature. As a result, the possibilities for the use of such networks are limited, particularly in the field of automobile instrument panels.

SUMMARY OF THE INVENTION

The object of the present invention is to further develop a circuit arrangement for controlling a rotary-magnet measuring instrument of the aforementioned type in such a way that, in order to linearize the approximately S-shaped characteristic curve of the rotary-magnet measuring instrument by a characteristic curve of the controlled source of current which is approximated by three straight line segments of differing slope, the points of inflection between the three straight lines as well as their slopes can be established in a precise manner, constant in time, at relatively little expense.

According to the invention, for the linearizing of an approximately S-shaped characteristic curve of the rotary-magnet measuring instrument (6) by a characteristic curve (B) of the controlled source of current which is approximated by three straight line segments of differing slope, a second amplifier (difference amplifier 8), which is controlled as a function of the input voltage, as well as a semiconductor path (2nd npn transistor 12) which is controlled by said amplifier and lies in series with the first input resistor ($R_1$) are provided, one input (10) of said second amplifier is connected to a constant voltage divider (divider resistors $R_3$, $R_5$) and, via a second feedback resistor ($R_4$), to the controlled semiconductor path and the first input resistor (at the point Y). The resistances of said second negative feedback resistor ($R_4$) and of the constant voltage divider (divider resistors $R_3$, $R_5$) are small as compared with that of the first input resistor ($R_1$).

This additional circuit for the controlled source of current with a second amplifier acts for parts of the characteristic curves or line segments as clamping circuit at one input of the first amplifier of the controlled current source and as additional negative feedback for an intermediate part of the characteristic curve or middle line segment. The transition points, between the parts of the characteristic curve or line segments as well as the slopes of the line segments are determined by the selection of active resistors, while the properties of the semiconductors used for the second amplifier and the controlled semiconductor path are not critical. Aside from this, the additional circuit for the controlled source of current requires only a few additional components.

As first and second amplifiers there may suitably be used difference amplifiers into which the variable input voltage or measurement voltage can be fed uncoupled from the negative feedback voltages or clamping voltages.

The input voltage of the second amplifier may be identical to the input voltage of the first amplifier or it may represent a voltage derived from the input voltage of the first amplifier, for instance from the output of the controlled source of current.

Further according to the invention there is provided a circuit arrangement having as first amplifier a difference amplifier the inverting input of which is connected to the first negative-feedback resistor and the first input resistor, comprising a difference amplifier (8) as a second amplifier to the non-inverting input (10) of which the second negative feedback resistor (R4) and the constant voltage divider (divider resistors $R_3$, $R_5$) are connected and the inverting input (9) of which is acted on by the input voltage (at terminal $E_1$).

Also according to the invention the inverting input (9) of the second amplifier (difference amplifier 8) is optionally connected to that input (3) of the first amplifier (difference amplifier 1) which is acted on by the input voltage or to an output (line 13) of the controlled source of current.

The controlled semiconductor path over which the second amplifier acts in the negative-feedback branch on one of the inputs of the first amplifier may suitably consist of the collector-emitter path of an npn-transistor (12) the dimensioning of which is non-critical.

BRIEF DESCRIPTION OF THE DRAWINGS

With the above and other objects and advantages in view, the present invention will become more clearly understood in connection with the detailed description of a preferred embodiment, when considered with the accompanying drawings, of which.

DETAILED DESCRIPTION OF THE PREFERRED EMBODIMENT

Figure 1:
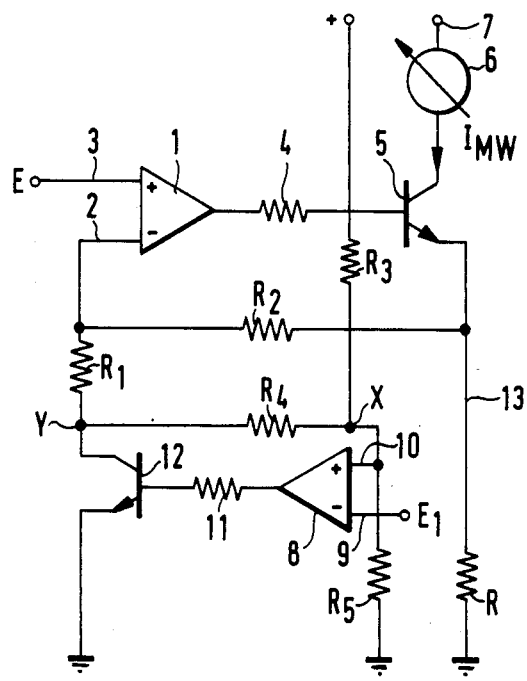
FIG. 1 is an embodiment of a circuit for the controlling of a rotary-magnet measuring instrument.

FIG. 1 shows a first difference amplifier 1 which has an inverting input 2 and a non-inverting input 3 and whose output is connected via a coupling resistor 4 to the base of an npn-transistor 5. In series with the collector-emitter path of the npn-transistor 5 there are a rotary-magnet measuring instrument 6 and load resistor R. A first relatively high-ohmic series resistor $R_1$ as well as a first negative-feedback resistor $R_2$ which is connected to the collector-emitter path of the npn-transistor 5 are connected to said inverting input 2. An input voltage (measurement voltage) which is fed into the non-inverting input 3 and the value of which is to be indicated by the rotary-magnet measuring instrument can be applied to a terminal E.

Assuming that terminal Y of resistor $R_1$ is at ground potential, the part of the circuit described up to now can be considered a conventional controlled source of current which, the collector-emitter path of the npn-transistor 5 independently of variations of an operating voltage at a terminal 7, and with various internal resistances of the rotary-magnet measuring instrument, produces a current proportional to the input voltage at the terminal 3. With suitable dimensioning of the first difference amplifier, the resistors $R_1$ and $R_2$ can furthermore be dispensed with, i.e. they can be replaced by a short-circuiting negative feedback line.

Insofar as the controlled source of current has a linear characteristic, the display—pointer deflection—of the rotary-magnet measuring instrument has a non-linear course as a function of the input voltage, corresponding to the approximately S-shaped characteristic curve of the rotary magnet measuring instrument.

In order, nevertheless, to obtain a linear relationship between the display of the rotary-magnet measuring instrument and the input voltage at the terminal E, the circuit arrangement is expanded as follows:

A second difference amplifier 8 having an inverting input 9 and a non-inverting input 10 is connected via another coupling resistor 11 to a base of a second npn-transistor 12 whose collector-emitter path is connected in series with the first series resistor $R_1$, and whose emitter is at ground potential. A negative-feedback branch having a second negative-feedback resistor $R_4$ extends from the common junction point of the first series resistor $R_1$ and transistor 12 to the non-inverting input 10 of the second difference amplifier 8. Furthermore, a constant voltage divider consisting of the divider resistors $R_3$ and $R_5$ is connected to the non-inverting input 10, as shown in FIG. 1. The inverting input 9 can be acted on via an input terminal $E_1$ by an input voltage which is identical to the input voltage at the input terminal E—this manner of operation is assumed below—or which is derived from the output potential on the output line 13 of the controlled source of current.

Figure 2:
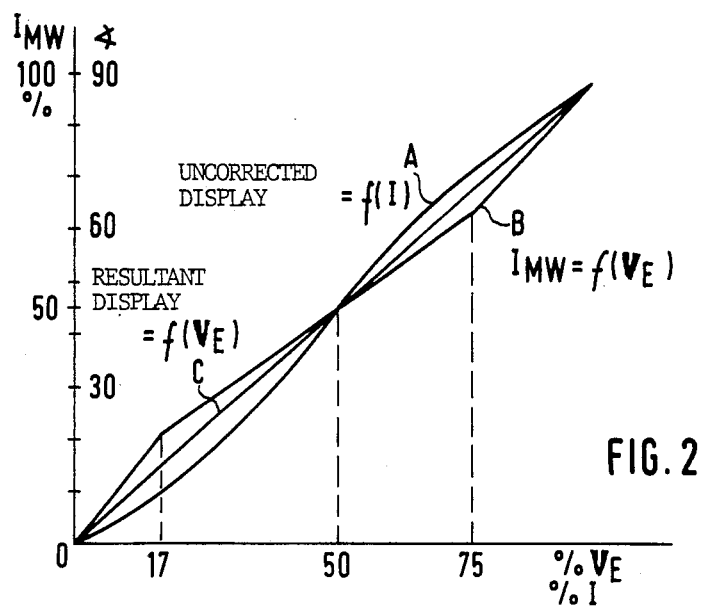
FIG. 2 is a graph showing characteristic curves thereof. de

The curve A in FIG. 2 represents an ordinary display characteristic curve of the rotary-magnet measuring instrument as a function of a current I flowing through it. A characteristic curve of the circuit arrangement which produces a current $I_{MW}$ as a function of input voltage $V_E$ and compensates for the non-linearities of the curve A is shown as curve B. From this there results a linearized display C of the rotary-magnet measuring instrument as a function of the input voltage $V_E$.

The action of the part of the circuit arrangement that produces the non-linear characteristic curve corresponding to curve B will be discussed below.

With very small input voltages $V_E$ at the input terminal $E_1$, the constant voltage, divided by the constant voltage divider $R_3$ and $R_5$, which is present at the non-inverting input 10 of the second difference amplifier predominates, so that the collector-emitter path of the second npn-transistor 12 is switched into the conductive state and brings the first series resistor $R_1$, essentially to ground. In this case, the resistors $R_1$ and $R_2$ in the negative-feedback branch of the controlled source of current containing the first difference amplifier 1 and the first npn-transistor 5 are active and determine a relatively large slope corresponding to the following equation:

$$\frac{\Delta I_{MW}}{\Delta V_E} = \frac{1 + \frac{R_2}{R_1}}{R}$$

Here, $I_{MW}$ is the output current of the controlled source of current which flows through the rotary-magnet measuring instrument.

The source of current operates with this slope up to a value of the input voltage $V_E$ near to the divided constant voltage between the point X and ground potential.

Above this value of the input voltage $V_E$ the difference amplifier 8 operates together with the non-transistor 12 as amplifier with the amplification factor V:

$$V = \frac{\Delta V_Y}{\Delta E} = 1 + \frac{R_4}{R_3//R_5}$$

Here, $V_Y$ is the voltage between the point Y in FIG. 1 and the ground potential. The voltage $V_Y$, present instead of ground potential at the first series resistor $R_1$, produces a reduction of the slope of the source of current in accordance with the amplification factor V at the inverting input 2 of the first difference amplifier 1. The slope of the middle section of the curve B can thus be determined by the amplification factor V. In the last-mentioned operating range of the circuit arrangement, the voltage $V_Y$ can become at most equal to the divided constant voltage at the point X since the resistances of the second negative-feedback resistor $R_4$ and of the constant voltage divider having the divider resistors $R_3$ and $R_5$ are small as compared with the resistance of the first input resistor $R_1$.

Therefore, if the input voltage at the input terminal $E_1$ exceeds the divided constant voltage, then the second difference amplifier 8 and the second npn-transistor 12 no longer affect the voltage $V_Y$. Once again, only the first negative-feedback resistor $R_2$ and the first series resistor $R_1$ in the negative feedback branch of the source of current act, they forming a voltage divider which is clamped fast by the divider resistors $R_3$ and $R_5$. This potential determines the second point of inflection of the curve B at about 75% $V_E$. The first point of inflection of the curve B at 17% $V_E$ was determined, as described above, in the manner that the potential at the input terminal $E_1$ reaches the divided constant voltage potential at the point X.

By the dimensioning of the divider resistors $R_3$ and $R_5$ as well as of the second negative-feedback resistor $R_4$, the two points of inflection and the ratio of the slopes of the circuit arrangement on the one hand in the first and third parts of the curve B to the middle part of this curve can be determined.

I claim:

1. In a circuit for controlling a rotary-magnet measuring instrument by an input voltage operative via a controlled source of current, the circuit comprising a first amplifier with a first negative-feedback resistor and a first input resistor, an improvement providing for the linearizing of an approximately S-shaped characteristic curve of the rotary-magnet measuring instrument by use of a characteristic curve of the controlled source of current, wherein the characteristic curve of the controlled source of current is established by three straight line segments of differing slope with a shape approximating the S-shaped characteristic curve; the improvement comprising:

a second amplifier constructed as a differential amplifier with a first input and a second input, said first input receiving a second input voltage corresponding to said first-mentioned input voltage;

a semiconductor path including a transistor driven by said second amplifier, said transistor being connected in series with said first input resistor, said first input resistor being connected between said transistor and a junction of the first feedback resistor with an input terminal of the first amplifier;

a voltage divider outputting a divider voltage, and a second negative feedback resistor, said second input of said second amplifier being connected to said voltage divider for receiving said divider voltage and being further connected via said second feedback resistor to said semiconductor path at a junction between said transistor and said first input resistor; and wherein the resistances of said second negative feedback resistor and of said voltage divider are small as compared with that of said first input resistor, said transistor is in a state of conduction producing essentially a grounding of said first input resistor when said input voltage is less than said divider voltage, a break point between two of said line segments occurring when said input voltage approaches said divider voltage, said transistor operates as an amplifier in concert with said second amplifier when said input voltage approximates said divider voltage to produce a middle one of said three line segments, and said transistor operates with a fixed voltage drop when said input voltage rises above said divider voltage to produce a third one of said three line segments.

2. A circuit according to claim 1, wherein said first amplifier is a difference amplifier having an inverting input terminal which is connected to said first negative-feedback resistor and to said first input resistor, and said second amplifier is a difference amplifier having a non-inverting input terminal connected to said second feedback resistor and to said voltage divider, and wherein said second amplifier has an inverting input terminal by which said second amplifier is acted on by the input voltage, said second feedback resistor providing negative feedback, and wherein said first input voltage is equal to said second input voltage.

3. A circuit according to claim 1, wherein said first amplifier has a non-inverting input terminal for receiving said input voltage;
said second amplifier has a non-inverting input terminal; and
said inverting input of said second amplifier selectively is connected to the non-inverting input terminal of said first amplifier to be acted on by the input voltage, or is connected to an output line of said controlled source of current.

4. A circuit according to claim 1, wherein said semiconductor path provides a negative feedback to said second amplifier, said semiconductor path extending to an input of said first amplifier and comprising the collector-emitter path of said transistor, the dimensioning of said transistor being non-critical to functioning of said semiconductor path.

5. A circuit according to claim 2, wherein said first amplifier has a non-inverting input terminal for receiving said input voltage;
said second amplifier has a non-inverting input terminal; and
said inverting input of said second amplifier selectively is connected to the non-inverting input terminal of said first amplifier to be acted on by the input voltage, or is connected to an output line of said controlled source of current.

6. A circuit for linearizing the response of a rotary magnet measuring instrument to an input voltage, comprising:

a first feedback amplifier responsive to said input voltage and having an output section connected to said instrument for applying current thereto, said first amplifier having a negative feedback responsive to current flow in said instrument;

a second feedback amplifier responsive to a reference voltage and to a signal designating an amount of the current flow in said instrument, said second amplifier having an output section coupled via a voltage divider network to a feedback circuit of said first amplifier, said divider network forming a part of a feedback circuit of said second amplifier, the feedback of said second amplifier being a negative feedback responsive to an output voltage of said output section of said second amplifier; and wherein said output section of said second amplifier operates in alternatively a state of saturation, a generally linear state, and a state of current cut-off dependent on a difference between said reference voltage and said designating signal to compensate the operation of said feedback circuit of said first amplifier in three ranges of current flow in said instrument; and wherein said circuit operates with a voltage compensation characteristic for linearizing the response of the measurement instrument such that said state of saturation produces a first of three line segments in a piecewise linear approximation to said voltage compensation characteristic for linearizing the response of the measuring instrument, said state of linear operation of said output section produces a second of the three line segments in a piecewise linear approximation to said voltage compensation characteristic for linearizing the response of the measuring instrument, and said state of current cut-off operation of said output section produces a third of the three line segments in a piecewise linear approximation to said voltage compensation characteristic for linearizing the response of the measuring instrument.

7. A linearizing circuit according to claim 6 wherein an input terminal of said second amplifier receives said designating signal, said input terminal of said second amplifier being connected to an input terminal of said first amplifier for receipt of said input voltage, said input voltage serving as said designating signal.

* * * * *